(12) United States Patent
Fazzio et al.

(10) Patent No.: US 8,230,562 B2
(45) Date of Patent: Jul. 31, 2012

(54) METHOD OF FABRICATING AN ACOUSTIC RESONATOR COMPRISING A FILLED RECESSED REGION

(75) Inventors: Ronald S. Fazzio, Loveland, CO (US); Richard C. Ruby, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 762 days.

(21) Appl. No.: 11/938,078

(22) Filed: Nov. 9, 2007

(65) Prior Publication Data

US 2008/0060181 A1 Mar. 13, 2008

Related U.S. Application Data

(62) Division of application No. 11/100,311, filed on Apr. 6, 2005, now Pat. No. 7,369,013.

(51) Int. Cl.
*H04R 17/10* (2006.01)
*B05D 1/32* (2006.01)

(52) U.S. Cl. ........ 29/25.35; 29/594; 29/846; 427/97.3; 427/98.4; 427/282

(58) Field of Classification Search ......... 29/594, 29/25.35, 846, 847; 216/41, 42; 310/312, 310/363, 364; 333/187, 189; 427/97.3, 98.4, 427/282
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandis et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |

(Continued)

FOREIGN PATENT DOCUMENTS

DE 10160617 6/2003

(Continued)

OTHER PUBLICATIONS

U.S. Appl. No. 10/971,169, filed Oct. 22, 2004, Larson III, John D., et al.

(Continued)

*Primary Examiner* — A. Dexter Tugbang

(57) ABSTRACT

A method for fabricating an acoustic resonator comprises providing a substrate; fabricating a first electrode adjacent the substrate; fabricating a piezoelectric layer adjacent the first electrode; depositing electrode material to form a second electrode up to a first thickness adjacent the piezoelectric layer; depositing a first photo mask over the second electrode; depositing additional electrode material to form the second electrode up to a second thickness; removing the photo mask thereby forming a recessed region in the second electrode; and filling the recessed region with a fill material.

5 Claims, 8 Drawing Sheets

U.S. PATENT DOCUMENTS

| | | | |
|---|---|---|---|
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Boloforosh |
| 5,475,351 A | 12/1995 | Uematsu et al. |
| 5,548,189 A | 8/1996 | Williams |
| 5,567,334 A * | 10/1996 | Baker et al. ............... 216/41 X |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,166,646 A | 12/2000 | Park et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |

| | | |
|---|---|---|
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 6,738,267 B1 | 5/2004 | Navas Sabater et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,842,089 B2 | 1/2005 | Lee |
| 6,853,534 B2 | 2/2005 | Williams |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Peczalski |
| 6,943,648 B2 | 9/2005 | Maiz et al. |
| 6,946,928 B2 | 9/2005 | Larson et al. |
| 6,954,121 B2 | 10/2005 | Bradley et al. |
| 1,670,365 A1 | 11/2005 | Turchi |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson |
| 7,098,758 B2 | 8/2006 | Wang et al. |
| 7,102,460 B2 | 9/2006 | Schmidhammer et al. |
| 7,128,941 B2 | 10/2006 | Lee |
| 7,138,889 B2 | 11/2006 | Lakin |
| 7,161,448 B2 | 1/2007 | Feng et al. |
| 7,170,215 B2 | 1/2007 | Namba et al. |
| 7,173,504 B2 | 2/2007 | Larson |
| 7,187,254 B2 | 3/2007 | Su et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,242,270 B2 | 7/2007 | Larson et al. |
| 7,259,498 B2 | 8/2007 | Nakatsuka et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,332,985 B2 | 2/2008 | Larson et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,408,428 B2 | 8/2008 | Larson, III |
| 7,414,349 B2 | 8/2008 | Sasaki |
| 7,414,495 B2 | 8/2008 | Iwasaki et al. |
| 7,423,503 B2 | 9/2008 | Larson, III |
| 7,425,787 B2 | 9/2008 | Larson, III |
| 7,439,824 B2 | 10/2008 | Aigner |
| 7,545,532 B2 | 6/2009 | Muramoto |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson et al. |
| 2005/0093653 A1 | 5/2005 | Larson, III |
| 2005/0093654 A1 | 5/2005 | Larson et al. |
| 2005/0093655 A1 | 5/2005 | Larson et al. |
| 2005/0093657 A1 | 5/2005 | Larson et al. |
| 2005/0093658 A1 | 5/2005 | Larson et al. |
| 2005/0093659 A1 | 5/2005 | Larson et al. |
| 2005/0104690 A1 | 5/2005 | Larson |
| 2005/0110598 A1 | 5/2005 | Larson, III |
| 2005/0128030 A1 | 6/2005 | Larson et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |

| | | | |
|---|---|---|---|
| 2005/0206483 A1 | 9/2005 | Pashby et al. | |
| 2005/0218488 A1 | 10/2005 | Matsuo | |
| 2006/0071736 A1 | 4/2006 | Ruby et al. | |
| 2006/0081048 A1 | 4/2006 | Mikado et al. | |
| 2006/0087199 A1 | 4/2006 | Larson et al. | |
| 2006/0103492 A1 | 5/2006 | Feng et al. | |
| 2006/0119453 A1 | 6/2006 | Fattinger et al. | |
| 2006/0125489 A1 | 6/2006 | Feucht et al. | |
| 2006/0132262 A1 | 6/2006 | Fazzio et al. | |
| 2006/0164183 A1 | 7/2006 | Tikka et al. | |
| 2006/0185139 A1 | 8/2006 | Larson, III et al. | |
| 2006/0197411 A1 | 9/2006 | Hoen et al. | |
| 2006/0238070 A1 | 10/2006 | Costa et al. | |
| 2006/0284707 A1 | 12/2006 | Larson et al. | |
| 2006/0290446 A1 | 12/2006 | Aigner et al. | |
| 2007/0037311 A1 | 2/2007 | Izumi et al. | |
| 2007/0080759 A1 | 4/2007 | Jamneala et al. | |
| 2007/0084964 A1 | 4/2007 | John et al. | |
| 2007/0085447 A1 | 4/2007 | Larson | |
| 2007/0085631 A1 | 4/2007 | Larson et al. | |
| 2007/0085632 A1 | 4/2007 | Larson et al. | |
| 2007/0086080 A1 | 4/2007 | Larson et al. | |
| 2007/0086274 A1 | 4/2007 | Nishimura et al. | |
| 2007/0090892 A1 | 4/2007 | Larson | |
| 2007/0170815 A1 | 7/2007 | Unkrich | |
| 2007/0171002 A1 | 7/2007 | Unkrich | |
| 2007/0176710 A1 | 8/2007 | Jamneala et al. | |
| 2007/0205850 A1 | 9/2007 | Jamneala et al. | |
| 2007/0279153 A1 | 12/2007 | Ruby | |
| 2008/0055020 A1 | 3/2008 | Handtmann et al. | |
| 2008/0297279 A1 | 12/2008 | Thalhammer et al. | |
| 2008/0297280 A1 | 12/2008 | Thalhammer et al. | |

FOREIGN PATENT DOCUMENTS

| | | | |
|---|---|---|---|
| EP | 0231892 | 8/1987 | |
| EP | 0637875 | 2/1995 | |
| EP | 0689254 | 6/1995 | |
| EP | 0865157 | 9/1998 | |
| EP | 0880227 | 11/1998 | |
| EP | 0973256 | 1/2000 | |
| EP | 1047189 | 10/2000 | |
| EP | 1100196 | 11/2000 | |
| EP | 1 096 259 | 5/2001 | |
| EP | 1 180 494 | 2/2002 | |
| EP | 1100196 A3 | 2/2002 | |
| EP | 1249932 | 10/2002 | |
| EP | 1 258 990 | 11/2002 | |
| EP | 1258989 | 11/2002 | |
| EP | 1542362 | 6/2003 | |
| EP | 1 517 443 | 3/2005 | |
| EP | 1517444 | 3/2005 | |
| EP | 1528674 | 5/2005 | |
| EP | 1528675 | 5/2005 | |
| EP | 1528676 | 5/2005 | |
| EP | 1528677 | 5/2005 | |
| EP | 1557945 | 7/2005 | |
| EP | 1 575 165 | 9/2005 | |
| GB | 1207974 | 10/1970 | |
| GB | 2013343 | 8/1979 | |
| GB | 2411239 | 8/2005 | |
| GB | 2418791 | 4/2006 | |
| GB | 2427773 | 1/2007 | |
| JP | 59023612 A * | 2/1984 | ............... 29/25.35 X |
| JP | 61054686 | 3/1986 | |
| JP | 1-157108 | 6/1989 | |
| JP | 06005944 | 1/1994 | |
| JP | 2001-257560 | 9/2001 | |
| JP | 2002-515667 | 5/2002 | |
| JP | 2002/217676 | 8/2002 | |
| JP | 2003/124779 | 4/2003 | |
| WO | WO-98/16957 | 4/1998 | |
| WO | WO 01/06647 | 1/2001 | |
| WO | WO-01/99276 | 12/2001 | |
| WO | WO 02/103900 | 12/2002 | |
| WO | WO-03/030358 | 4/2003 | |
| WO | WO 03/043188 | 5/2003 | |
| WO | WO-03/050950 | 6/2003 | |
| WO | WO-03/058809 | 7/2003 | |
| WO | WO-2004/034579 | 4/2004 | |
| WO | WO 2004/051744 | 6/2004 | |
| WO | WO 2004/102688 | 11/2004 | |
| WO | WO-2005/043752 | 5/2005 | |
| WO | WO-2005/043753 | 5/2005 | |
| WO | WO-2005/043756 | 5/2005 | |
| WO | WO-2006/018788 | 2/2006 | |

OTHER PUBLICATIONS

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

Jiang, Yimin et al., "A Novel Single-Phase Power Factor Correction Scheme", *IEEE*, (1993),287-292.

Ruby, R. C., "Micro-Machined Thin Film Bulk Acoustic Resonators", *Proc. IEEE 48th, Symposium on Frequency control*, (1994),135-138.

Larson III, J. D., et al., "Measurement of Effective Kt2q,RpRs vs. Temperature for Mo/AlN/Mo Resonators", *2002 IEEE Ultrasonics Symposium*, Munich, Germany, (Oct. 2002),915-919.

Aoyama, T. et al., "Diffusion of Boron, Phosphorous, Arsenic and Antimony in Thermally Grown SiliconDioxide", *Fiujitsu Labs, J. Electromechanical Soc.*, vol. 146, No. 5, (1999),1879-1883.

Parker, T. E., et al., "Temperature-Compensated Surface Acoustic-Wave Devices with SiO2 Film Overlays", *J. Appl. Physics*, vol. 50, (1360-1369),Mar. 1979.

Tsubbouchi, K. et al., "Zero Temperature coefficient Surface Acoustic Wave Devices using Epitaxial AlN Films", *IEEE Ultrasonic symposium*, San Diaego, CA, 1082, (1982),240-245.

Lakin, K. M., "Thin Film Resonators and Filters", *IEEE Untrasonics Symposium*, Caesar's Tahoe, NV, (Oct. 1999),895-906.

Lakin, K. M., et al., "Temperature Compensated Bulk Acoustic Thin Film Resonators", *IEEE Ultrasonics Symposium*, San Juan, Puerto Rico, (Oct. 2000),855-858.

Ohta, S. et al., "Temperature Characteristics of Solidly Mounted Piezoelectric Thin Film Resonators", *IEEE Ultrasonics Symposium*, Honolulu, HI, (Oct. 2003),2011-2015.

Bauer, L. O., et al., "Properties of Silicon Implanted with Boron Ions through Thermal Silicon Dioxide", *Solid State Electronics*, vol. 16, No. 3, (Mar. 1973),289-300.

Topich, J. A., et al., "Effects of Ion Implanted Flourine in Silicon Dioxide", *Nuclear Instr. and Methods, Cecon Rec*, Cleveland, OH, (May 1978),70-73.

Spangenberg, B. et al., "Dependence of the Layer Resistance of Boron Implantation in Silicon and the Annealing Conditions", *Comptus Rendus de l'Academic Bulgare des Sciences*, vol. 33, No. 3, (1980),325-327.

Hara, K. "Surface Treatment of Quartz Oscillator Plate by Ion Implantation", *Oyo Buturi*, vol. 47, No. 2, (Feb. 1978),145-146.

Ng, J. et al., "The Diffusion Ion-Implanted Boron in Silicon Dioxide", *AIP Conf. Proceedings*, No. 122, (1984),20-33.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials for BAW Resonators and Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Conrol Symposium and PDA Exhibition*, (Jan. 2, 2002),8-14.

Jung, Jun-Phil et al., "Experimental and Theoretical Investigation on the Relationship Between AIN Properties and AIN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AlN Film Using MOCVD for 5GHx Band FBAR Filter", *2003 IEEE Ultrasonics Symposium*, (Oct. 5, 2003),pp. 170-173.

Martin, Steven J., et al., "Development of a Low Dielectric Constant Polymer for the Fabrication of Integrated Circuit Interconnect", *12 Advanced Materials*, (Dec. 23, 2000),1769-1778.

Hadimioglu, B. et al., ""Polymer Films As Acoustic Matching Layers".", *1990 IEEE Ultrasonics Symposium Proceedings*, vol. 3 PP., [Previously submitted As "Polymer Files As Acoustic Matching Layers, 1990 IEEE Ultrasonics Symposium Proceeding. vol. 4 pp. 1227-1340, Dec. 1990". Considered by Examiner on Mar. 20, 2007,(Dec. 1990),1337-1340.

"Search Report from corresponding application No. ", GB 0605779.8, (Aug. 23, 2006).

"Examination Report from UK for application", GB 0605971.1, (Aug. 24, 2006).

"Examination report corresponding to application No.", GB0605770.7, (Aug. 25, 2006).

"Examination Report corresponding to application No.", GB0605775.6, (Aug. 30, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23,2006).

Coombs, Clyde F., et al., "Electronic Instrument Handbook", *Second Edition, McGraw-Hill, Inc.*, (1995),pp. 5.1 to 5.29.

"A partial GB Search Report for", Application No. GB0522393.8, (Jan. 9, 2006),4 pages.

"A partial GB Search Report for Application No.", GB0525884.3, (Feb. 2, 2006),4 pgs.

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.* 54 (10), (Oct. 1983),5893-5910.

"Search Report from corresponding application", No. GB0605225.2, (Jun. 26, 2006).

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britain Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", *0-7803-8331-1/4/W20.00; IEEE.MTT-S Digest*, (2004),927-929.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoelectric Transformers", *IEEE*, (2001),492-496.

Auld, B.A., "Acoustic Resonators," Acoustic Fields and Waves in Solids, Second Edition, vol. II, pp. 250-259 (1990), Krieger Publishing Co., Malabar, Florida.

British Application No. 0605222.9 Search Report dated Jul. 11, 2006.

Al-Ahmad, M. et al., "Piezoelectric-Based Tunable Microstrip Shunt Resonator", *Proceedings of Asia-Pacific Microwave Conference* 2006.

Lakin, K.M., "Thin Film BAW Filters for Wide Bandwidth and High Performance Applications", *IEEE Microwave Symposium Digest*; vol. 2 Jun. 6-11, 2004, 923-926.

Lakin, et al., "Wide Bandwidth Thin Film BAW Filters", *2004 IEEE Ultrasonics Symposium*, vol. 1, Aug. 2004, 407-410.

Pang, W. et al., "High Q Single-Mode High-Tone Bulk Acoustic Resonator Integrated With Surface-Machined FBAR Filter", *Microwave Symposium Digest, IEEE MTT-S International* 2005, 413-416.

Sanchez, A.M. et al., "Mixed analytical and numerical design method for piezoelectric transformers", *IEEE,PESX* Jun. 2003, 841-846.

Vasic, D et al., "A New Method to Design Piezoelectric Transformer Used in MOSFET & IGBT Drive Circuits", *IEEE 34th Anuual Power Electronics Specialists Conference*, 2003 vol. 1 Jun. 15-19, 2003, 307-312.

Vasic, D et al., "A New MOSFET & IGBT Gate Drive Insulated by a Piezoelectric Transformer", *IEEE 32 nd Annual Power Electronics Specialists Conference*, 2001 vol. 3 2001, 1479-1484.

\* cited by examiner

METHOD OF FABRICATING AN ACOUSTIC RESONATOR COMPRISING A FILLED RECESSED REGION

CROSS-REFERENCE TO RELATED APPLICATIONS

The present application is a division of U.S. patent Ser. No. 11/100,311, now U.S. Pat. No. 7,369,013, entitled "ACOUSTIC RESONATOR PERFORMANCE ENHANCEMENT USING RECESSED REGION" filed on Apr. 6, 2005 and claims benefit of priority under 35 U.S.C. §121 therefrom. The entire disclosure of the parent application is specifically incorporated herein by reference.

BACKGROUND

The need to reduce the cost and size of electronic equipment has created a need for smaller single filtering elements. Thin-Film Bulk Acoustic Resonators (FBARs) and Stacked Thin-Film Bulk Wave Acoustic Resonators (SBARs) represent one class of filter elements with potential for meeting these needs. These filters can collectively be referred to as FBARs. An FBAR is an acoustic resonator that uses bulk longitudinal acoustic waves in thin-film piezoelectric (PZ) material. Typically, an FBAR includes a layer of PZ material sandwiched between two metal electrodes. The combination PZ material and electrodes are suspended in air by supporting the combination around its perimeter or are placed over an acoustic mirror.

When an electrical field is created between the two electrodes, the PZ material converts some of the electrical energy into mechanical energy in the form of acoustic waves. The acoustic waves propagate generally in the same direction as the electric field and reflect off the electrode-air or electrode-acoustic mirror interface at some frequency, including at a resonance frequency. At the resonance frequency, the device can be used as an electronic resonator. Multiple EBARs can be combined such that each is an element in RF filters.

Ideally, the resonant energy in the filter elements is entirely "trapped" in the resonator. In practice, however, dispersive modes exist. These modes can result in a decreased quality factor (Q) for the filter.

For these and other reasons, a need exists for the present invention.

SUMMARY

One aspect of the present invention provides an acoustic resonator that includes a substrate, a first electrode, a layer of piezoelectric material, a second electrode, and a fill region. The first electrode is adjacent the substrate, and the first electrode has an outer perimeter. The piezoelectric layer is adjacent the first electrode. The second electrode is adjacent the piezoelectric layer and the second electrode has an outer perimeter. The fill region is in one of the first and second electrodes.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
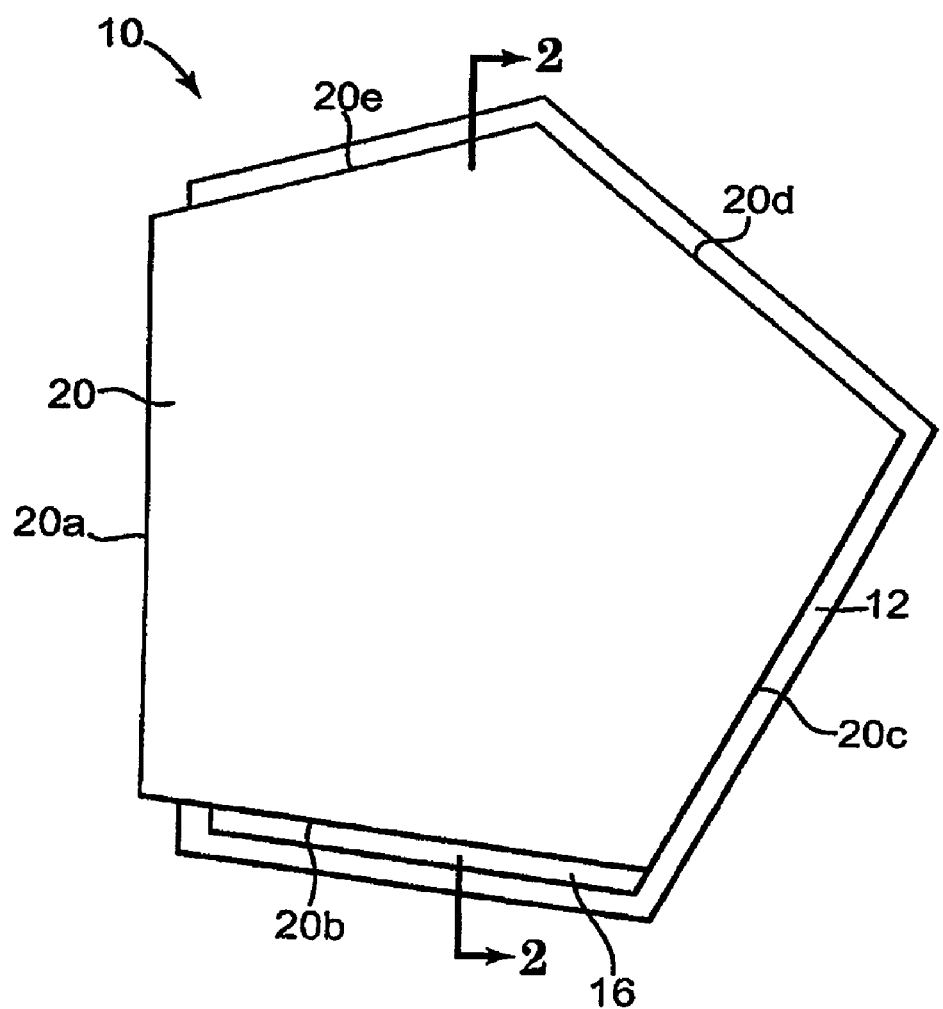
FIG. 1 illustrates a top plan view of an FBAR.
Figure 2:
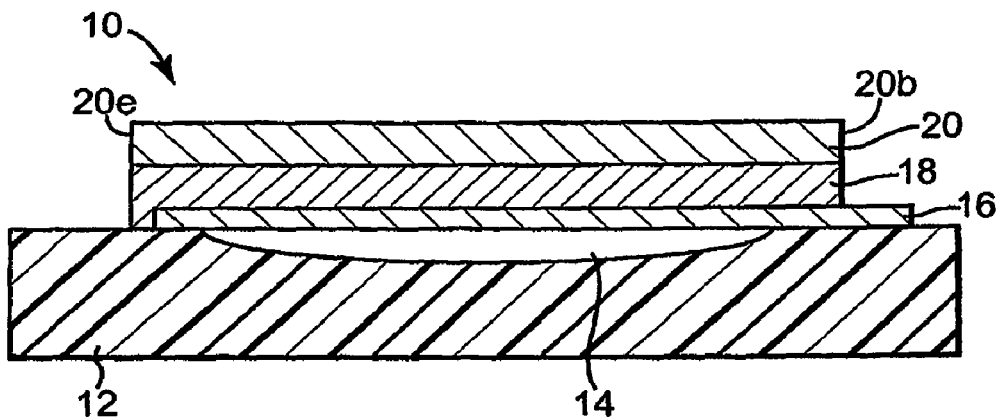
FIG. 2 illustrates a cross-sectional view of an FBAR.

FIGS. 1 and 2 illustrate top and cross-sectional views, respectively, of FBAR 10. FBAR 10 includes substrate 12, depression 14, first electrode 16, piezoelectric (PZ) layer 18, and second electrode 20. In FIG. 1, PZ layer 18 and depression 14 are hidden from view. Second electrode 20 has a perimeter that is illustrated in FIG. 1 as pentagon-shaped, having edges 20a, 20b, 20c, 20d and 20e. Two edges, 20b and 20e, are illustrated in the cross-sectional view of FIG. 2. Typically, contacts (not illustrated) are coupled to first electrode 16 and to second electrode 20 and a passivation layer (not illustrated) may cover top electrode 20. The contacts facilitate connecting the first and second electrodes 16 and 20 to a source of voltage.

First electrode 16, PZ layer 18, and second electrode 20 collectively form an FBAR membrane. The FBAR membrane is adjacent substrate 12 and suspended over depression 14 to provide an electrode-air interface. In one embodiment, depression 14 is created by etching away a portion of substrate 12. Depression 14 is deep enough so that sufficient electrode-air interface is created under the FBAR membrane.

In an alternative embodiment, the FBAR membrane may be placed adjacent an acoustic mirror (not illustrated in FIGS. 1 and 2) formed within substrate 12. In this way, an electrode-acoustic mirror interface is formed. The resonator thus formed is a Solid Mounted Resonator (SMR).

In one embodiment, substrate 12 is made of silicon (Si) and PZ layer 18 is made from aluminum nitride (AlN). Alternatively, other piezoelectric materials may be used for PZ layer 18. In one embodiment, first and second electrode 16 and 20 may be made of molybdenum (Mo). Alternatively, other materials may be used for the electrodes. In one embodiment, the contacts may be made of gold (Au). Alternatively, other materials may be used for the contacts.

FBAR 10 illustrated in FIGS. 1 and 2 is configured to use longitudinal or shear acoustic waves propagating in PZ layer 18. When an electric field is created between first and second electrodes 16 and 20 via an impressed voltage, the piezoelectric material of PZ layer 18 converts some of the electrical energy into mechanical energy in the form of acoustic waves. So configured, FBAR 10 exhibits dispersive modes resulting in a quality factor (Q) loss for FBAR 10.

Figure 3:
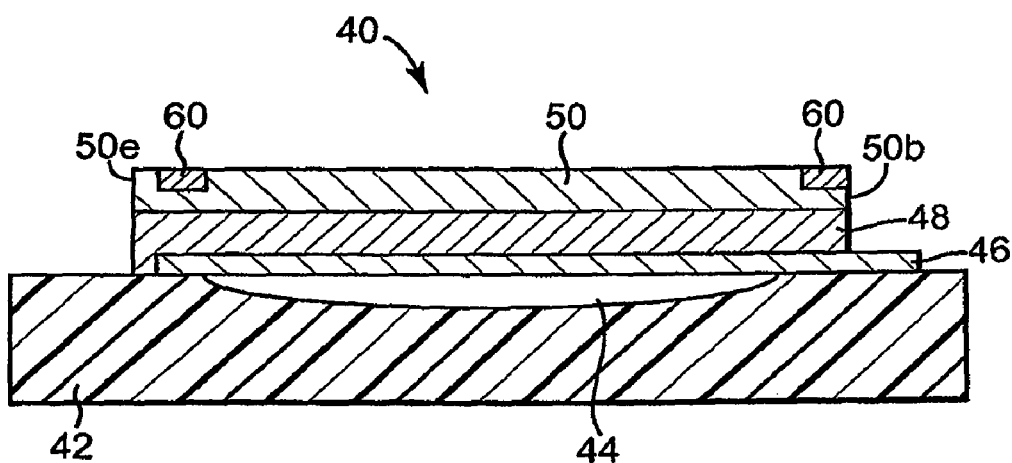
FIG. 3 illustrates a cross-sectional view of an FBAR according to one embodiment of the present invention.

FIG. 3 illustrates a cross-sectional view of FBAR 40 in accordance with one embodiment of the present invention. FBAR 40 includes substrate 42, depression 44, first electrode 46, piezoelectric (PZ) layer 48, second electrode 50 and filled region 60. Typically, contacts (not illustrated in FIG. 3) are coupled to first and second electrodes 46 and electrode 50, and a passivation layer covers the second electrode (also not illustrated in FIG. 3). The contacts facilitate connecting first and second electrodes 46 and 50 to a voltage source. First electrode 46, PZ layer 48, and second electrode 50 collectively form an FBAR membrane, which may be placed over a depression 44 or over an acoustic mirror as discussed above. The FBAR membrane is illustrated adjacent substrate 42 and suspended over depression 44 to provide an electrode-air interface. As with previous embodiments, an electrode-acoustic mirror interface is also obtainable using an SMR design in accordance with the present invention.

Second electrode 50 and the other layers of the FBAR membrane have a perimeter that can be of various configurations. For example, the perimeters of each can be pentagon-shaped, similar to FBAR 10 above. They could also be any of various polygonal shapes, circular, or various irregular shapes. The cross-sectional view illustrated in FIG. 3 illustrates two locations along the perimeter of second electrode 50, edges 50b and 50e. In one embodiment, an edge of PZ layer 48 is generally aligned with edge 50b of second electrode 50 in the vertical direction in FBAR 40 as illustrated in FIG. 3.

In FBAR 40 illustrated in FIG. 3, a filled region 60 has been added into second electrode 50 adjacent the edge 50b and near edge 50e of second electrode 50. In one embodiment, fill region 60 is located just outside the perimeter of depression 44. In this way, when the perimeter or outside diameter of depression 44 is extended in the vertical direction (as oriented in the illustration of FIG. 3), fill region 60 is just "outside" the perimeter of depression 44.

In other embodiments, fill region 60 overlaps the perimeter of depression 44 such that part of fill region 60 is "inside" and part is "outside" the perimeter of depression 44. In still other embodiments, fill region 60 lies entirely "inside" the perimeter of depression 44.

Fill region 60 improves the performance of FBAR 40, resulting in improved insertion loss and improved resonator quality factor Q of FBAR 40. The overall quality factor Q of FBAR 40 depends proportionally on a parameter of resistance called $R_p$. In FBAR 40, the $R_p$ may be improved by fill region 60.

An electric field is created between first and second electrodes 46 and 50 via an impressed voltage. The piezoelectric material of PZ layer 48 converts some of the electrical energy into mechanical energy in the form of acoustic waves. Some of the acoustic waves in FBAR 40 are longitudinal acoustic waves of any mode type, while others are transverse acoustic waves of the compression, shear, or drum mode type. FBAR 40 is designed to use longitudinal acoustic waves propagating in the thickness extensional direction in the PZ layer 48 as the desired resonator mode. However, FBAR 40, which provides fill region 60, reduces or suppresses energy loss, thereby improving the Q of the filter. In one embodiment, fill region 60 helps trap energy from lateral modes in FBAR 40.

In one embodiment, fill region 60 is filled with a material that is different than that used for second electrode 50. In that case, the material in fill region 60 will have different dispersion characteristics than will the remaining material of second electrode 50, which in one case is Mo. Adding this material with differing dispersion characteristics can improve insertion loss and improve the resonator quality factor Q of FBAR 40. In one embodiment, the material in fill region 60 increases the FBAR membrane's stiffness at its edge. In one case, the material in fill region 60 is such that it increases the acoustic impedance of the fill region 60 relative to that at the center of the FBAR membrane. Such material may be denser than the electrode material. For example, the material in fill region 60 can be W, while second electrode 50 is made of Mo. In other embodiments first and second electrodes 46 and 50 may be metal such as Pt, W, Cu, Al, Au, or Ag. In alternative embodiments, material in fill region 60 could also be made of materials such as polyimide, BCB, $SiO_2$, $Si_3N_4$, or other dielectrics, AlN, ZnO, $LiNbO_3$, PZT, $LiTaO_3$, $Al_2O_3$, or other piezoelectric materials, Pt, W, Cu, Al, Au, Ag, or other metals or alloys of metals.

In one embodiment, fill region 60 has a depth in second electrode 50 that is on the order of hundreds to thousands of angstroms, and a width on the order of fractions of a micron to microns or even larger, up to that portion of the width of second electrode 50 that extends beyond or outside the perimeter of depression 44. In one embodiment, second electrode 50 is selectively etched to form a recessed feature that is then filled in with material to form fill region 60. In one embodiment, second electrode 50 is constructed using a lift-off technique to form a recessed feature that is filled in with material to form fill region 60.

Figure 4:
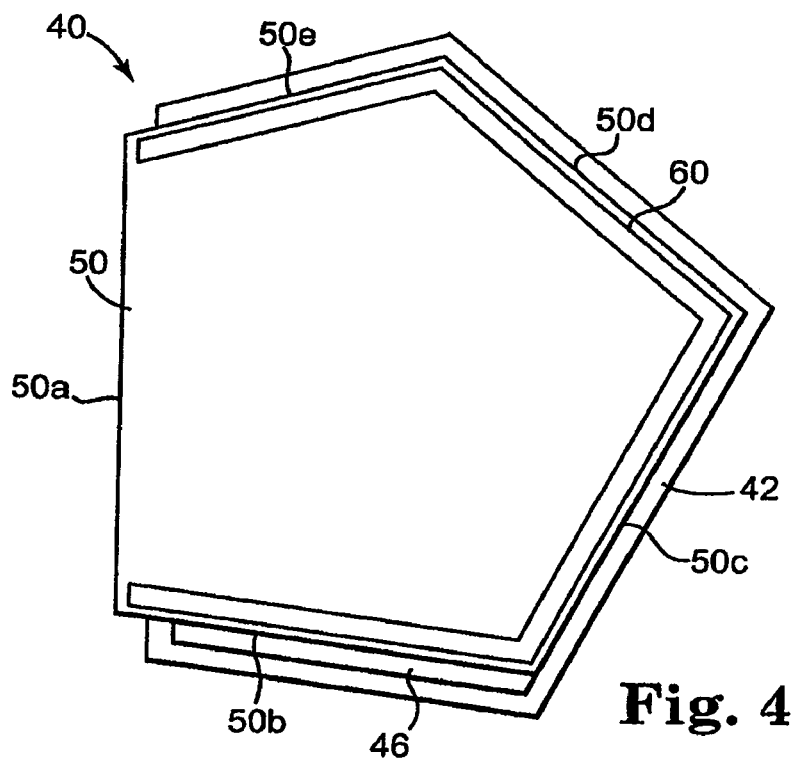
FIG. 4 illustrates a top plan view of one embodiment of the FBAR illustrated in FIG. 3.
Figure 5:
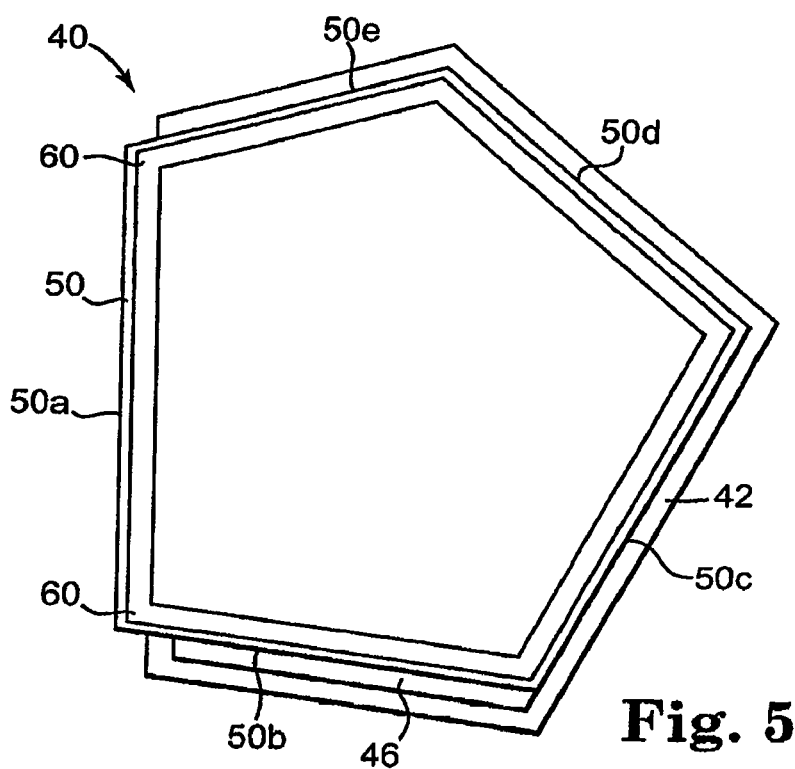
FIG. 5 illustrates a top plan view of an alternative embodiment of the FBAR illustrated in FIG. 3.

FIGS. 4 and 5 illustrate plan views of FBAR 40 of FIG. 3 in accordance with alternative embodiments of the present invention. As illustrated in FIGS. 4 and 5, FBAR 40 includes substrate 42, first electrode 46, and second electrode 50. In FIGS. 4 and 5, piezoelectric (PZ) layer 48 and depression 44 are hidden from view. Typically, contacts (not illustrated in the Figures) are coupled to first and second electrodes 46 and 50, and a passivation layer (also not illustrated in the Figures) covers second electrode 50.

In FIGS. 4 and 5, fill region 60 is illustrated extending adjacent the perimeter of second electrode 50. In the Figures, the perimeter of second electrode 50 is generally pentagon-shaped having five relatively straight edges (50a, 50b, 50c, 50d, and 50e), but may also be essentially any polygonal shape, circular in shape, or have any other smooth or irregular shape.

In FIG. 5, fill region 60 is illustrated extending adjacent the perimeter of second electrode 50 along all of the five edges of the pentagon-shaped electrode, that is, adjacent edges 50a, 50b, 50c, 50d, and 50e. FIG. 4 illustrates an alternative embodiment of FBAR 40 where fill region 60 extends adjacent the perimeter of second electrode 50 along four of the five edges of the pentagon-shaped electrode, that is, adjacent edges 50b, 50c, 50d, and 50e. In one embodiment, a contact is attached to the fifth edge 50a of second electrode 50, so fill region 60 does not extend along that edge in that embodiment.

As one skilled in the art will understand, any number of alternative fill regions 60 may be provided adjacent the edges of second electrode 50 consistent with the present invention. Fill region 60 may be continuously extending along some or all of the edges of second electrode 50 as illustrated, fill regions 60 may have smaller segments that are not continuous along the edge, and other shapes and configurations of fill regions 60 can be used, especially where second electrode 50 is a shape other than a pentagon.

Figure 6:
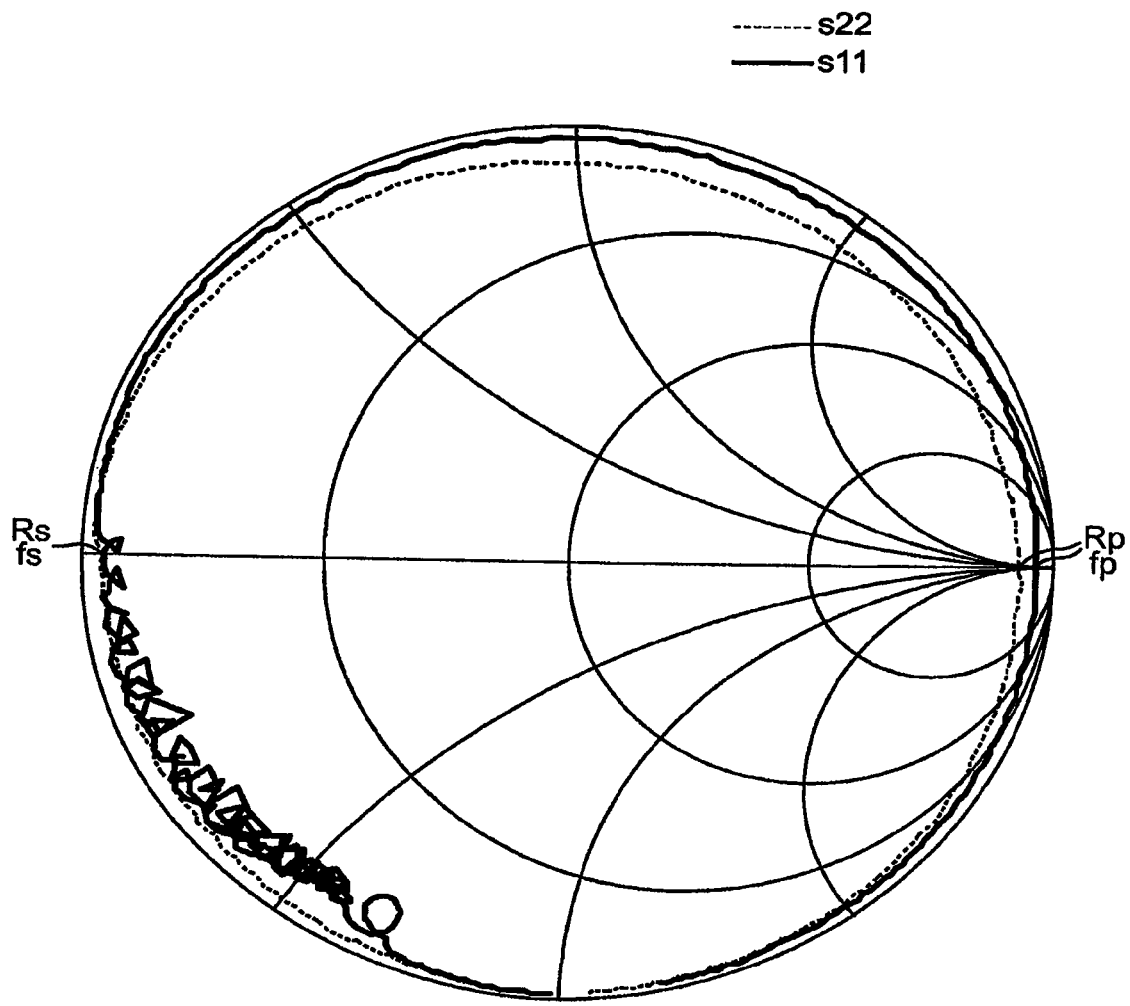
FIG. 6 illustrates Q circles for two exemplary FBARs plotted on a Smith chart.

FIG. 6 illustrates Q circles for two exemplary FBARs plotted on a Smith chart, and illustrates improvement in $R_p$ and therefore Q in one of the FBARs. As is known in the art, a Smith Chart is a polar plot of a complex impedance (used in FIG. 6 to illustrate measures of s11 and s22 scattering parameters). These s11 and s22 scattering parameters represent a ratio of complex amplitudes of backward and forward waves. The Smith Chart aids in translating the reflection coefficients into impedance and it maps part of the impedance placed into a unit circle. The improved performance of FBAR 40 is demonstrated by the Q circles illustrated in FIG. 6. FIG. 6 illustrates the S-parameter measurements of an exemplary filled device, such as FBAR 40 with fill region 60. As illustrated, the filled device of FBAR 40 with fill region 60 (solid line labeled S11) has a much improved $R_p$ versus that of a control device, such as that illustrated in FIG. 2 (dashed line labeled S22) in the upper half of the chart.

Generally, the horizontal axis passing through the unit circle represents real impedance, the area above the axis represents inductive reactance and the area below represents capacitive reactance. The left-hand portion of the chart at zero reactance represents series resonance frequency (fs) and occurs where the Q circle crosses the real axes on the left side of the Smith Chart. The left-hand portion of the chart also demonstrates the parameter of resistance $R_s$. The right-hand portion of the chart at zero reactance represents parallel resonant frequency (fp) and occurs where the Q circle crosses the real axes on the right side of the Smith Chart. The right-hand portion of the chart also demonstrates the parameter of resistance $R_p$. The closer that a plot of FBAR filter characteristics on a Smith Chart is to the perimeter of the Smith Chart, the higher the Q will be for that FBAR. Also, the more smooth that the curve is, the lower the noise is in the FBAR.

In FIG. 6, the performance of FBAR 40 as a filter is illustrated by the solid line Q circle s1 and the performance of a prior art FBAR without a filled region in the electrode is illustrated by the dashed line Q circle s22. As evident, FBAR 40 improves the quality of the filter near the frequency fp. FBAR 40, illustrated by Q circle s11, more closely approximates a unit circle in the upper half of the unit circle and is representative of a less lossy device in that area, which improves the performance of FBAR 40 when used in a filter.

FIG. 6 also illustrates that FBAR 40 used as a filter actually enhances spurious modes below the series resonant frequency fs, as indicated in the lower-left side or "southwest" quadrant of the unit circle. When FBAR 40 is used in applications where the increase in noise in this frequency regime does not impair the device performance, the improvements illustrated in the other areas of the unit circle can be exploited. For example, in some embodiments FBAR 40 is used as a resonator in a filter application that employs a half-ladder topology. The performance of the filter benefits from the improved $R_p$, and any noise introduced by the increased spurious modes lies outside the filter passband.

Figure 7:
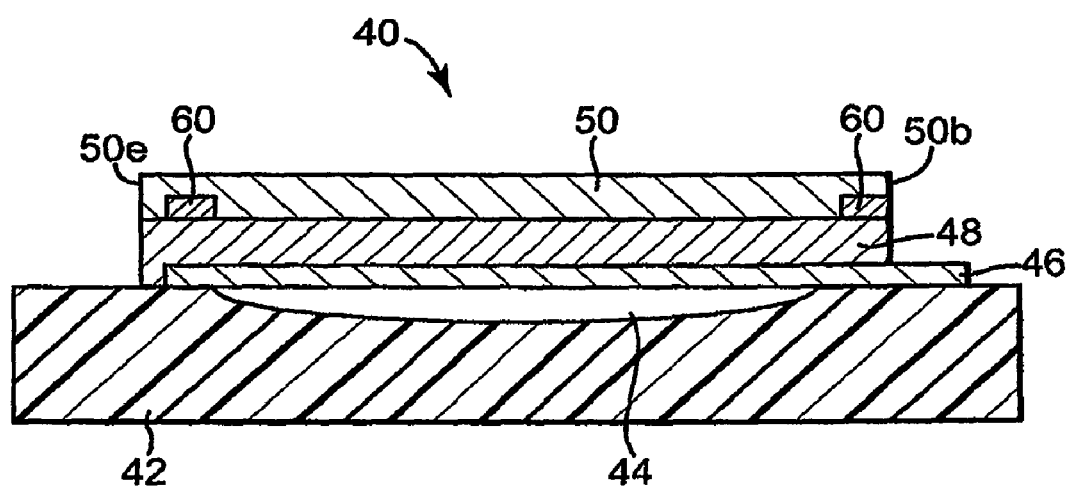
FIG. 7 illustrates a cross-sectional view of an FBAR according to one embodiment of the present invention.

FIG. 7 illustrates a cross-sectional view of FBAR 40 in accordance with an alternative embodiment of the present invention. FBAR 40 is essentially the same as that illustrated in FIG. 3, and includes substrate 42, depression 44, first electrode 46, piezoelectric (PZ) layer 48, second electrode 50 and fill region 60. Two edges, 50b and 50e, of the perimeter of second electrode 50 are also illustrated. In addition, however, FBAR 40 illustrated in FIG. 7, has fill region 60 formed in a surface of second electrode 50 that is opposite the surface in which fill region 60 was formed in FIG. 3. As FBAR 40 is depicted in FIG. 3, fill region 60 is on the "top" surface of second electrode 50, whereas as FBAR 40 is depicted in FIG. 7, fill region 60 is on the "bottom" surface of second electrode 50. In one embodiment, fill region 60 depicted in FIG. 7 is also outside the edge of the perimeter of depression 44. In alternative embodiments fill region 60 overlaps the perimeter of depression 44, and in other embodiments, fill region 60 lies entirely inside the perimeter of depression 44.

In one embodiment, the performance of FBAR 40 as illustrated in FIG. 7 is essentially the same as that described above for FBAR 40 as depicted in FIG. 3. Fill region 60 on the "bottom" surface of second electrode 50 can be achieved in a variety of ways known by those skilled in the art. For example, the structure illustrated in FIG. 7 could be constructed by using a lift-off process (i.e., mask, material deposition, and lift-off) after piezoelectric deposition, followed by deposition of the top electrode material.

Figure 8:
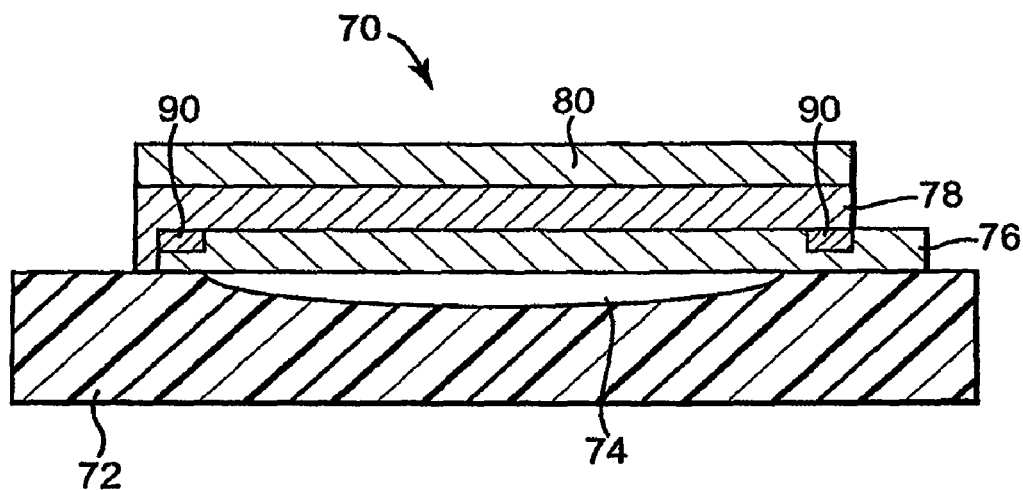
FIG. 8 illustrates a cross-sectional view of an FBAR according to another embodiment of the present invention.
Figure 9:
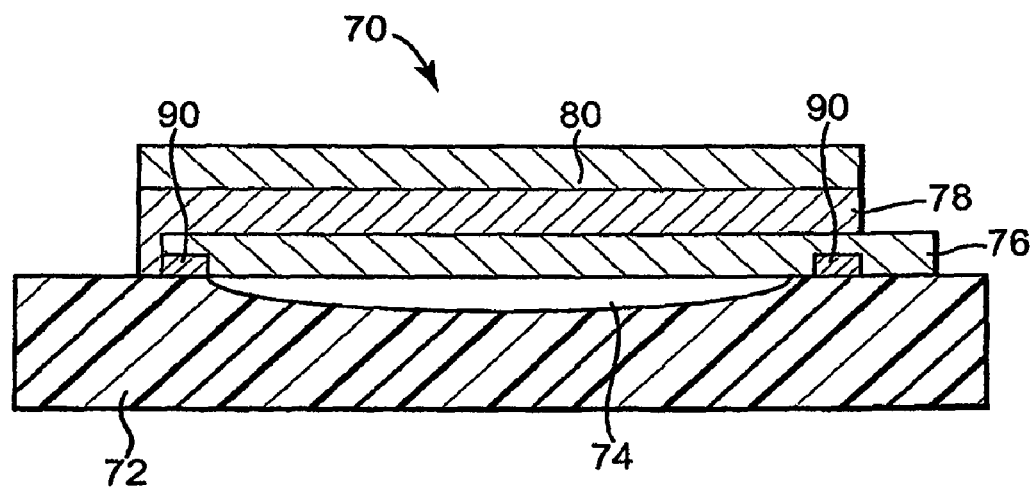
FIG. 9 illustrates a cross-sectional view of an FBAR according to another embodiment of the present invention.

FIGS. 8 and 9 illustrate cross-sectional views of FBAR 70 in accordance with alternative embodiments of the present invention. FBAR 70 includes substrate 72, depression 74, first electrode 76, piezoelectric (PZ) layer 78, second electrode 80, and fill material 90. Typically, contacts (not illustrated in the Figures) are coupled to first and second electrodes 76 and 80. Also, an optional passivation layer (not illustrated in the Figures) may be used to cover second electrode 80. The contacts facilitate connecting first and second electrodes 76 and 80 to a voltage source. First electrode 76, PZ layer 78, and second electrode 80 collectively form an FBAR membrane, which may be placed over a depression 74 or over an acoustic mirror as discussed above. The FBAR membrane is illustrated adjacent substrate 72 and suspended over depression 74 to provide an electrode-air interface. As with previous embodiments, an electrode-acoustic mirror interface is also obtainable using an SMR design in accordance with the present invention.

FBAR 70 is similar to FBAR 30 illustrated in FIG. 3; however, FBAR 70 has fill region 90 inserted in first electrode 76, rather than in the second electrode as above. Fill region 90 inserted in first electrode 76 also improves the performance of FBAR 70, resulting in improved insertion loss and improved resonator quality factor Q of FBAR 70. In FIG. 8, fill region 90 is illustrated adjacent the "top surface" of first electrode 76 and in FIG. 9, fill region 90 is illustrated adjacent the "bottom surface" of first electrode 76. In each case, fill region 90 is illustrated just outside the perimeter of depression 74. In this way, when the perimeter or outside diameter of depression 44 is extended in the vertical direction (as oriented in the illustration of FIGS. 8 and 9), fill region 90 is just "outside" the perimeter of depression 74. In alternative embodiments, fill region 90 overlaps the perimeter of depression 74, and in other embodiments, fill region 90 lies entirely inside the perimeter of depression 74. Like fill region 60 described previously with respect to FBAR 40, fill region 90 improves the performance of FBAR 70, resulting in improved noise reduction and improved resonator quality factor Q of FBAR 70.

As with embodiments above, fill region 90 is filled with a material that is different than that used for second electrode 80. In that case, the material in fill region 90 will have different dispersion characteristics than will the remaining material of second electrode 80, which in one case is Mo. Adding this material with differing dispersion characteristics can improve insertion loss and improve the resonator quality factor Q of FBAR 70. In one embodiment, the material in fill region 90 increases the FBAR membrane's stiffness at its edge. In one case, the material in fill region 90 is such that it increases the acoustic impedance of the fill region 90 relative to that at the center of the FBAR membrane. Such material may be denser than the electrode material. For example, the material in fill region 90 can be W, while second electrode 80 is made of Mo.

In other embodiments first and second electrodes 76 and 80 may be metal such as Pt, W, Cu, Al, Au, or Ag. In alternative embodiments, material in fill region 90 could also be made of materials such as polyimide, BCB, $SiO_2$, $Si_3N_4$, or other dielectrics, AlN, ZnO, $LiNbO_3$, PZT, $LiTaO_3$, $Al_2O_3$, or other piezoelectric materials, Pt, W, Cu, Al, Au, Ag, or other metals or alloys of metals.

FBARs 40 and 70 may be fabricated in a variety of ways consistent with the present invention. In one embodiment, for example, a recessed region is created in the top electrode by first depositing electrode metal to a thickness slightly less than the desired thickness. Then a photo mask is used to pattern the center region of the resonator. The remaining thickness of electrode metal is then deposited, and a lift-off process is used to remove the resist remaining in the recessed area. An additional photo mask is then used to pattern the fill region. Fill material is deposited in the fill region, and the mask and fill material outside the fill region are removed in a lift-off process. In another embodiment, the recessed region may be produced by first depositing electrode metal to the desired thickness, patterning the electrode with a photo mask, and etching the recessed region. In another embodiment, the fill material may be produced by first depositing fill material, patterning the fill region with a photo mask, and etching away the fill material outside the fill region.

Figure 10A:
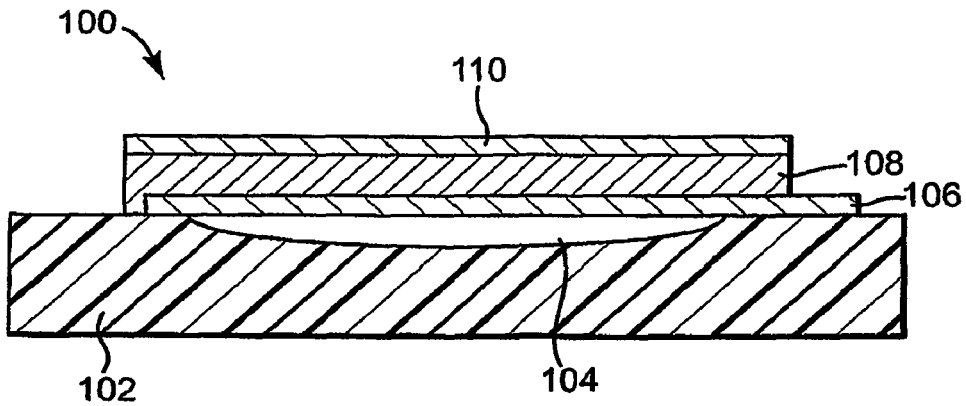
FIGS. 10A-10F are cross-sectional views illustrating various stages of fabrication of an FBAR according to another embodiment of the present invention.

FIGS. 10A-10F are cross-sectional views illustrating various intermediate stages of fabrication of FBAR 100 according to one embodiment of the present invention. FBAR 100 is similar to those illustrated in FIGS. 3-9, and includes substrate 102, depression 104, first electrode 106, piezoelectric (PZ) layer 108, and second electrode 110, which collectively form an FBAR membrane. FIG. 10A illustrates FBAR 100 prior to formation of a fill region 120 (illustrated in FIG. 10F and analogous to above-described fill regions 60 and 90).

Figure 10B:
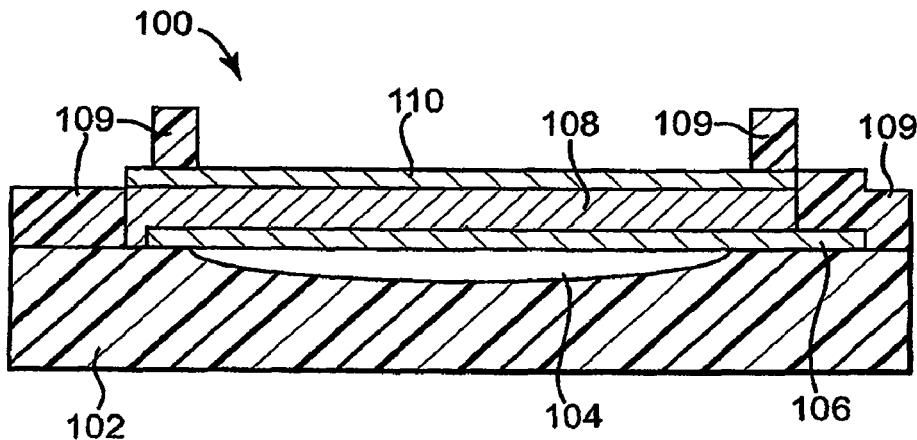
Figure 10C:
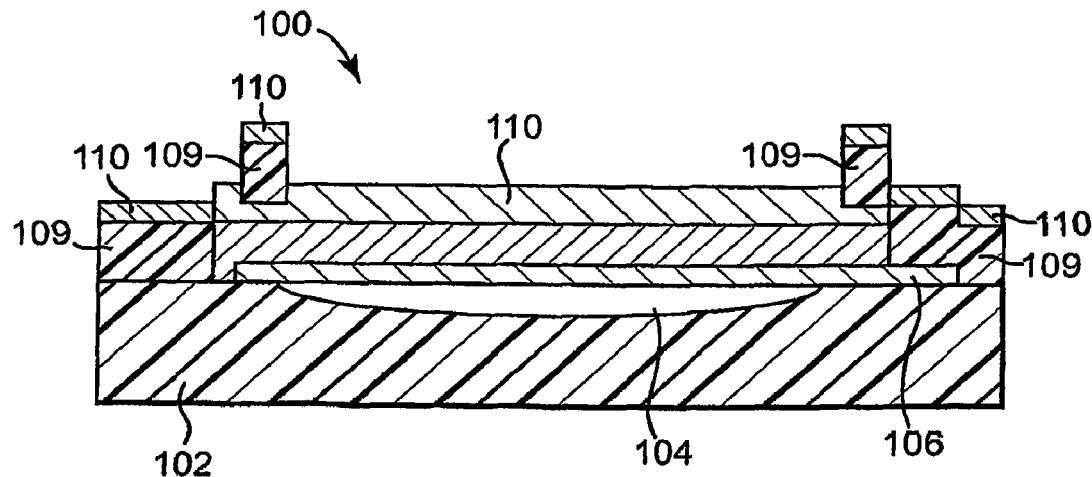
Figure 10D:
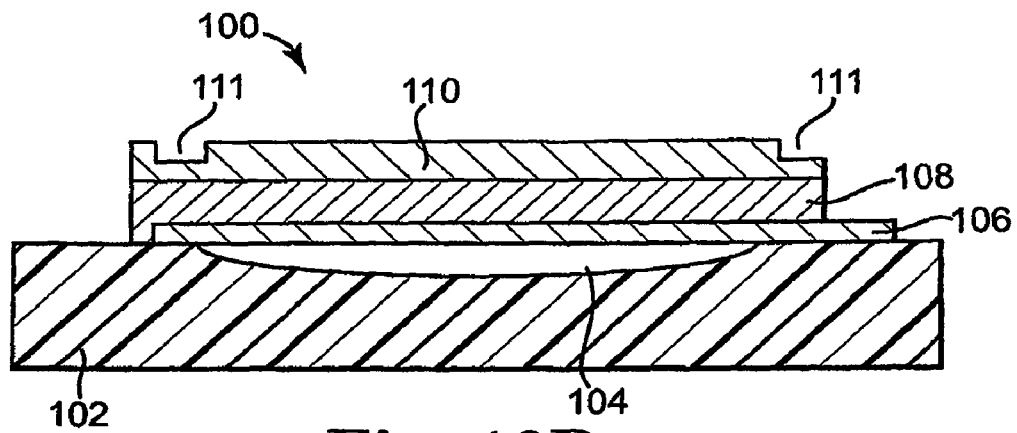

FIG. 10B illustrates FBAR 100 with a photo mask 109 deposited over the FBAR membrane. Photo mask 109 is used to pattern a recessed region using a lift-off process. FIG. 10C illustrates FBAR 100 of FIG. 10B after additional electrode material metal 110 is deposited, but before the lift-off process. FIG. 10D illustrates FBAR 100 after the lift-off process. The lift off process removes photo mask 109 and all metal 10 that is on photo mask 109. In this way, the lift-off process defines a recessed region 111.

Figure 10E:
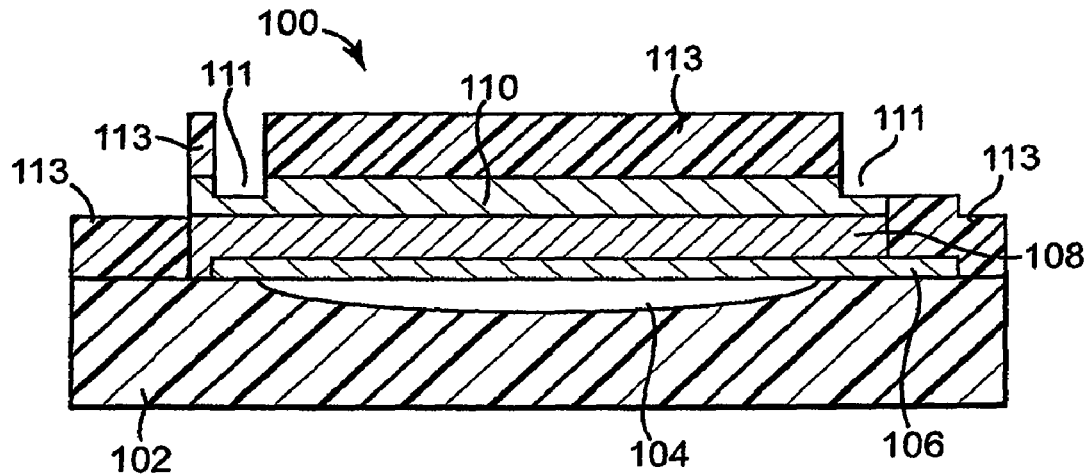
Figure 10F:
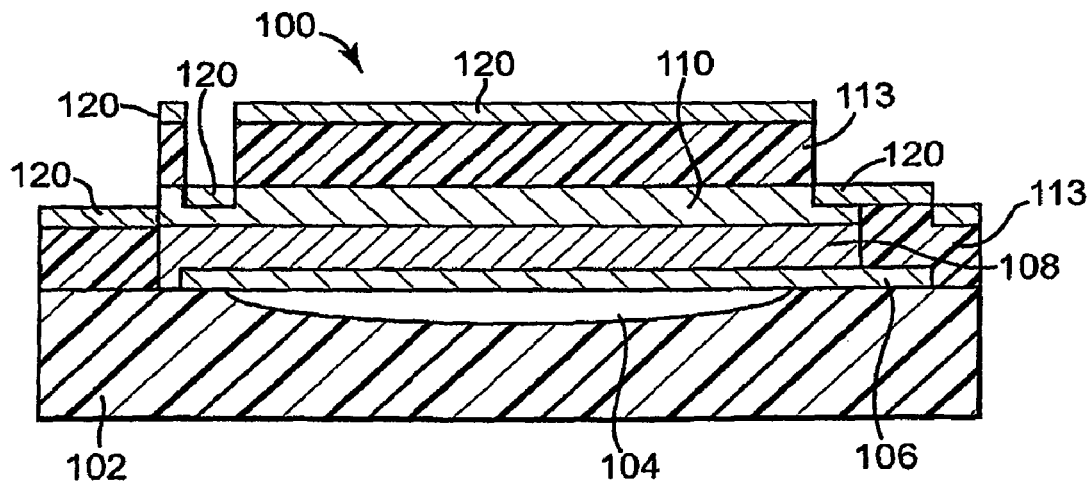

Next, FIG. 10E illustrates FBAR 100 with a photo mask 113 deposited over the FBAR membrane to pattern the fill. FIG. 10F illustrates FBAR 100 of FIG. 10E after fill material 120 deposition, but before the lift-off process. After the lift off process, FBAR 40 of FIG. 3 illustrates the resulting structure. In some embodiments, the FBAR may additionally utilize at least one passivation layer.

A filled recessed region on the bottom electrode may be constructed similarly. Furthermore, the top of the fill region does not necessarily need to align with the surface of the electrode, whether the fill region resides in the top electrode or bottom electrode. The recess in the FBAR can be generated by a lift-off process, but can also be made with an etch step. The fill material may be patterned in the recessed region by first masking with a photo mask, depositing metallization, and then using a lift-off to leave fill material in the recessed region. Fill material can also be added by first using a metal deposition, followed by a photo mask and an etch.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating an acoustic resonator comprising:
   providing a substrate;
   fabricating a first electrode adjacent the substrate;
   fabricating a piezoelectric layer adjacent the first electrode;
   depositing electrode material to form a second electrode up to a first thickness adjacent the piezoelectric layer;
   depositing a first photo mask over the second electrode;
   depositing additional electrode material over at least a portion of the first photo mask to form the second electrode up to a second thickness;
   removing the photo mask thereby forming a recessed region in the second electrode; and
   filling the recessed region with a fill material.

2. The method of claim 1, further including depositing a second photo mask over the second electrode before filling the recessed region.

3. The method of claim 1 further including forming a depression in the substrate.

4. The method of claim 1 further including filling the recessed region with a different material than the electrode material.

5. The method of claim 1, wherein filling the recessed region includes filling with a material selected from the group consisting of:
   dielectrics, metals, metal alloys, piezoelectrics, Mo, Pt, Al, Cu, W, Au, Ag, polyimide, BCB, $SiO_2$, $Si_3N_4$, AN, ZnO, $LiNbO_3$, PZT, $LiTaO_3$, and $Al_2O_3$.

* * * * *